US012774965B2

(12) United States Patent
Tajima et al.

(10) Patent No.: US 12,774,965 B2

(45) Date of Patent: Oct. 27, 2026

(54) DIELECTRIC SPECTROMETRY DEVICE

(71) Applicant: NTT, Inc., Tokyo (JP)

(72) Inventors: Takuro Tajima, Tokyo (JP); Masahito Nakamura, Tokyo (JP); Michiko Seyama, Tokyo (JP)

(73) Assignee: NTT, INC., Tokyo (JP)

( * ) Notice: Subject to any disclaimer, the term of this patent is extended or adjusted under 35 U.S.C. 154(b) by 91 days.

(21) Appl. No.: 18/866,751

(22) PCT Filed: May 20, 2022

(86) PCT No.: PCT/JP2022/020947

§ 371 (c)(1),
(2) Date: Nov. 18, 2024

(87) PCT Pub. No.: WO2023/223541

PCT Pub. Date: Nov. 23, 2023

(65) Prior Publication Data

US 2025/0321196 A1 Oct. 16, 2025

(51) Int. Cl.

*G01N 22/00* (2006.01)
*G01R 29/08* (2006.01)
*G01R 35/00* (2006.01)

(52) U.S. Cl.

CPC ......... *G01N 22/00* (2013.01); *G01R 29/0878* (2013.01); *G01R 35/005* (2013.01)

(58) Field of Classification Search

CPC ... G01N 22/00; G01R 29/0878; G01R 35/005
USPC .......................................................... 324/642
See application file for complete search history.

(56) References Cited

U.S. PATENT DOCUMENTS

| | | | | |
|---|---|---|---|---|
| 5,578,932 A * | 11/1996 | Adamian | G01R 35/005 324/73.1 |
| 7,532,014 B2 * | 5/2009 | Chladek | G01R 35/005 324/638 |
| 2013/0293249 A1 * | 11/2013 | Han | G01R 31/2822 324/750.02 |

FOREIGN PATENT DOCUMENTS

| | | |
|---|---|---|
| JP | 07198767 A | 8/1995 |
| JP | 2005069779 A | 3/2005 |

OTHER PUBLICATIONS

Gregory et al., "A Review of RF and Microwave Techniques for Dielectric Measurements on Polar Liquids," IEEE Transactions on Dielectrics and Electrical Insulation vol. 13, No. 4; Aug. 2006, pp. 727-743.

* cited by examiner

*Primary Examiner* — Roberto Velez
(74) *Attorney, Agent, or Firm* — Slater Matsil, LLP

(57) ABSTRACT

In a sensor part of a dielectric spectrometry device, an antenna section of a coaxial line structure with an open end on a side that is to contact a sample, an open section of a coaxial line structure with an open end on a side that is to contact the air, a short section of a coaxial line structure in which a center conductor and a ground are conductive at a distal end portion, a load part which terminates a signal line, and a switch which selectively connects one of the antenna section, the open section, the short section, and the load part to a port of a reflection measurement instrument are formed on the same substrate.

16 Claims, 6 Drawing Sheets

DIELECTRIC SPECTROMETRY DEVICE

CROSS-REFERENCE TO RELATED APPLICATIONS

This application is a national phase entry of PCT Application No. PCT/JP2022/020947, filed on May 20, 2022, which application is hereby incorporated herein by reference.

TECHNICAL FIELD

The present invention relates to a dielectric spectrometry device used for non-invasive component concentration measurement in humans or animals.

BACKGROUND

As the population continues to age, dealing with adult diseases is becoming a major issue. Tests such as those for blood sugar levels require blood sampling which places a heavy burden on patients. For this reason, non-invasive component concentration measurement devices which do not require blood sampling are attracting attention.

A device using dielectric spectroscopy has been proposed as a non-invasive component concentration measurement device. In dielectric spectroscopy, the skin is irradiated with electromagnetic waves, the electromagnetic waves are absorbed by utilizing the interaction between blood components to be measured (for example, glucose molecules) and water, and the amplitude and phase of the electromagnetic waves are observed. However, since the interaction between glucose and electromagnetic waves is small and there are limits to the intensity of electromagnetic waves which can be safely radiated to living organisms, they have not been sufficiently effective in measuring blood sugar levels in living organisms.

As a device in the related art, there is a device using a coaxial probe which irradiates a measurement target with electromagnetic waves in the microwave to millimeter wave band (refer to PTL 1). FIG. 6 shows a configuration example of a component concentration measurement device using a coaxial probe disclosed in PTL 1. The component concentration measurement device includes a coaxial probe 100 whose end portion on the sample side is an open portion, an electronic calibration module 101, and a vector network analyzer (hereinafter referred to as VNA) 102.

In the example of FIG. 6, the concentration of the target component in a solution in which the background component and the target component are mixed is measured. As described in NPL 1, the configuration shown in FIG. 6 is a common configuration for measuring complex dielectric constant and the open coaxial probe 100 is suitable for measuring liquids. The VNA 102 calculates a complex dielectric constant from the reflected signal obtained by the coaxial probe 100, assuming an infinite boundary. Specifically, an electric field is applied to a sample from the coaxial probe 100. The VNA 102 calculates a complex dielectric constant by measuring a reflection coefficient and a phase of the reflected wave reflected by the sample in the frequency domain. This method is called a frequency domain reflection method.

Also, there is also a method of applying a pulsed electric field to a sample and determining a complex dielectric constant from a time change in waveform of the reflected wave reflected by the sample. When applying a pulsed electric field, a transmission coefficient may be measured instead of a reflection coefficient. The method for determining a complex dielectric constant from a time change of a waveform of a reflected wave is called a time-domain reflectometry or a time-domain transmission measurement.

In the frequency domain reflection method, the frequency of the applied electric field is swept to obtain the reflection coefficient and the phase spectrum. The complex dielectric constant can be calculated from the measured spectrum as follows.

Equation 1

$$\frac{(\varepsilon^* - \varepsilon_A^*)(\varepsilon_B^* - \varepsilon_C^*)}{(\varepsilon^* - \varepsilon_B^*)(\varepsilon_C^* - \varepsilon_A^*)} = \frac{(\rho^* - \rho_A^*)(\rho_B^* - \rho_C^*)}{(\rho^* - \rho_B^*)(\rho_C^* - \rho_A^*)} \quad (1)$$

Here, $\varepsilon^*$ is a dielectric constant of a sample and $\varepsilon_i^*$ (i=A, B, C) is a dielectric constant of the standard sample. When $\rho^*$ is a complex reflection coefficient, a reflection coefficient obtained through measurement is assumed to be $\Gamma_i$, and a phase is assumed to be $\varphi_i$, a relation thereof is expressed by the following Expression (2).

Equation 2

$$\rho_i^* = \Gamma_i \exp(j\phi_i) \quad (2)$$

$\rho_i$ corresponds to a measurement result of a standard sample and $\rho^*$ is a measurement result of a sample. In a typical measurement, a state in which the coaxial probe 100 is installed in the air (open state) is defined as Standard Sample A, a state in which the coaxial probe 100 is shorted (shorted state) is defined as Standard Sample B, and a standard solution sample with a known dielectric constant is defined as Standard Sample C. At the time of shorting the coaxial probe 100, it is necessary to terminate the probe so that inductance does not occur at a termination portion.

As described above, the component concentration measurement device calculates a dielectric relaxation spectrum from the amplitude and a phase of a signal corresponding to a frequency of observed electromagnetic waves. Generally, the complex dielectric constant is calculated by expressing the dielectric relaxation spectrum as a linear combination of relaxation curves on the basis of the Cole-Cole expression. In measuring biological components, for example, there is a correlation between an amount of blood components such as glucose and cholesterol contained in blood and the complex dielectric constant. Thus, electrical signals (amplitude, phase) corresponding to changes in the amount of blood components can be obtained. A calibration model is constructed by measuring the correlation difference between the complex dielectric constant change and the component concentration in advance and the component concentration is calibrated from the change in the measured dielectric relaxation spectrum. Note that it is also possible to calibrate the component concentration from the change in the reflection coefficient by measuring the correlation between the change in the reflection coefficient and the concentration of the component in advance.

In a reflection measurement instrument in which the reflection coefficient is calculated by measuring an incident voltage and a reflected voltage, it is known that drift errors in the reflection coefficient occur due to fluctuations in environmental temperature and vibrations and stress applied to measurement cables. Generally, as shown in FIG. 6, fluctuations occurring in the VNA 102 and measurement cables are automatically recalibrated for each measurement by connecting the electronic calibration module 101 to the coaxial probe 100 and using the sequential calibration function of the electronic calibration module 101. Such a sequential calibration function can reduce cable instability and system drift errors (refer to PTL 2).

However, although system fluctuation factors from the VNA 102 to the electronic calibration module 101 can be calibrated in the configuration in the related art, it is difficult to calibrate drift errors caused by the coaxial probe 100. For this reason, in order to maintain measurement accuracy, it is necessary to measure the standard sample multiple times at the end face of the coaxial probe 100. In addition, there is a problem in which measurement reproducibility and measurement accuracy cannot be obtained due to changes in sample temperature and drying.

CITATION LIST

Patent Literature

PTL 1—Japanese Patent Application Publication No. 2005-69779

PTL 2—Japanese Patent Application Publication No. H7-198767

Non Patent Literature

NPL 1—Andrew P. Gregory, and Robert N. Clarke, “A Review of RF and Microwave Techniques for Dielectric Measurements on Polar Liquids”, IEEE Transactions on Dielectrics and Electrical Insulation, Vol. 13, No. 4, August 2006

SUMMARY

Technical Problem

Embodiments of the present invention were made to solve the above problems, and an object of embodiments of the present invention is to provide a dielectric spectrometry device which can reduce drift errors caused by a coaxial probe.

Solution to Problem

A dielectric spectrometry device of embodiments of the present invention includes: a sensor part; and a calibration unit which calibrates a reflection measuring device connected to the sensor part, in which the sensor part includes an antenna section of a coaxial line structure with an open end on a side that is to contact a target sample, an open section of a coaxial line structure with an open end on a side that is to contact the air, a short section of a coaxial line structure in which a center conductor and a ground are conductive at a distal end portion, a load part which terminates a signal line, and a switch configured to selectively connect any one of the antenna section, the open section, the short section, and the load part to a port of the reflection measurement device formed on the same substrate, and the calibration unit controls the switch to sequentially connect the short section, the open section, and the load part to the port of the reflection measurement device to perform reflection measurement, respectively and calibrates the reflection measurement device on the basis of a result of reflection measurement.

Advantageous Effects

According to embodiments of the present invention, since an antenna section, a short section, an open section, and a load part are integrated on the same substrate, it is possible to reduce a drift error caused by a coaxial probe. Furthermore, according to embodiments of the present invention, it becomes easy to calibrate a reflection measurement device at any time. As a result, in embodiments of the present invention, it is possible to perform broadband data acquisition while reducing drift errors due to environmental changes and changes in the state of the sample over time.

DETAILED DESCRIPTION OF ILLUSTRATIVE EMBODIMENTS

Figure 1:
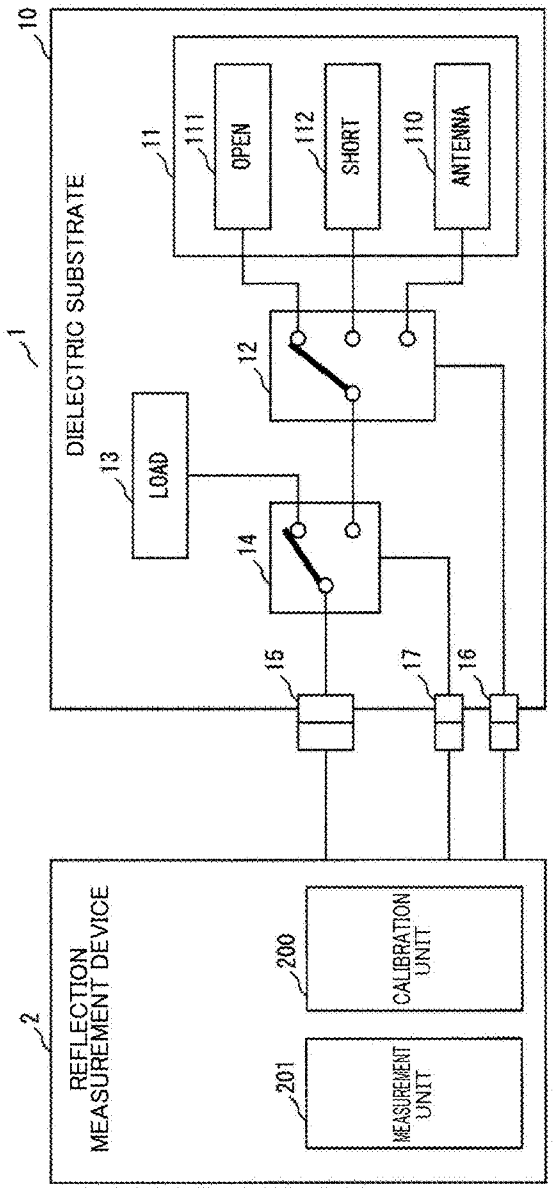
FIG. 1 is a block diagram showing a configuration of a dielectric spectrometry device according to an embodiment of the present invention.

Embodiments of the present invention will be described below with reference to the drawings. In an embodiment, in order to solve the above problem, dielectric spectroscopic measurement is performed with high accuracy while sequentially calibrating the drift error. FIG. 1 shows a configuration of a dielectric spectrometry device according to the embodiment. The dielectric spectrometry device is composed of a sensor part 1 and a reflection measurement device 2. For example, a vector network analyzer (VNA) is used as the reflection measurement device.

The sensor part 1 includes a dielectric substrate 10, a coaxial probe 11, a switch 12, a load part 13, a switch 14, an RF connector 15, and control connectors 16 and 17.

Figure 2:
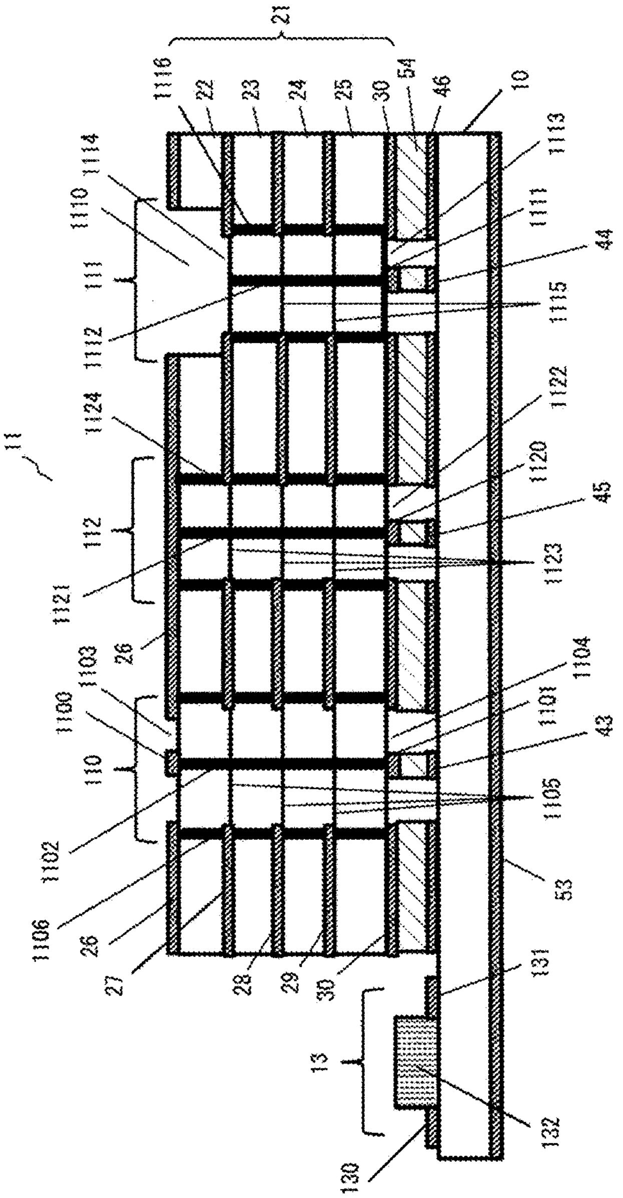
FIG. 2 is a cross-sectional view of a sensor part according to the embodiment of the present invention.
Figure 3:
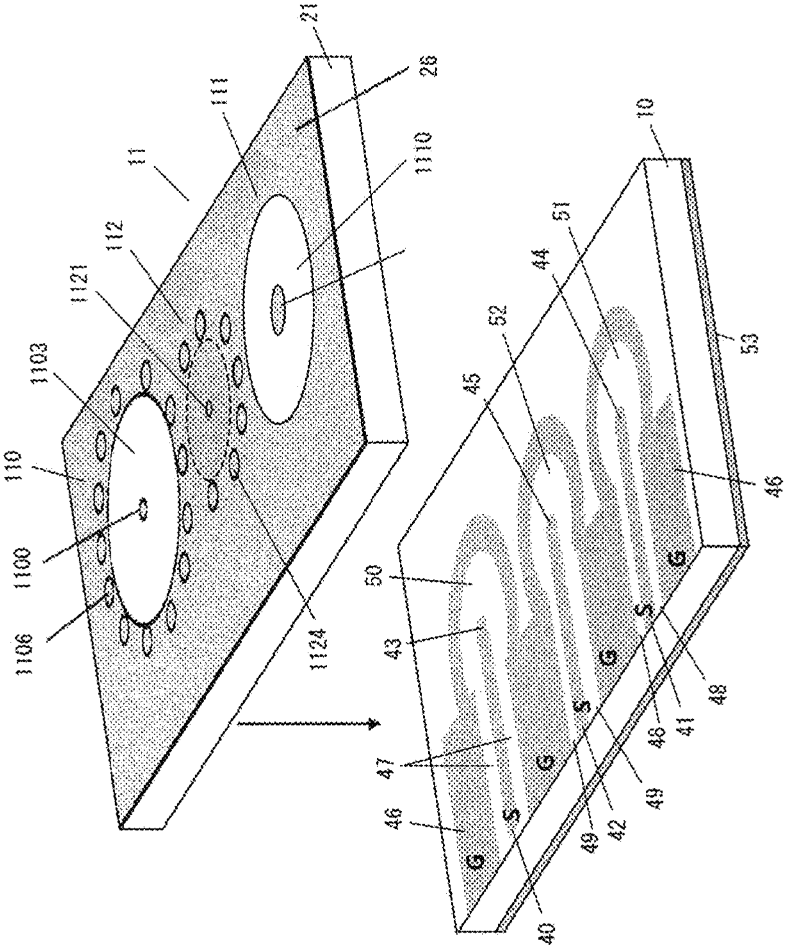
FIG. 3 is an exploded perspective view of the sensor part according to the embodiment of the present invention.

FIG. 2 is a cross-sectional view of the sensor part 1 and FIG. 3 is an exploded perspective view of the sensor part 1. The coaxial probe 11, the switches 12 and 14, the load part 13, the RF connector 15, and the control connectors 16 and 17 are installed in the dielectric substrate 10.

The coaxial probe 11 includes a plurality of coaxial probe parts. The probe part includes at least one antenna section 110, an open section 111, and a short section 112.

In a microwave and millimeter wave band radio frequency (RF) technique, in order to reduce insertion loss between an integrated circuit (IC) and an antenna or sensor, a configuration in which an IC, an antenna, and a sensor are integrated on the same dielectric substrate is known, and a multilayer wiring board is used for optimizing the disposition of signal lines and power lines and reducing the board area. Vias and through holes passing through the board passes are used as structures for transmitting RF signals between the layers of a multilayer wiring board.

Japanese Patent No. 6771372 discloses a quasi-coaxial line structure in which a plurality of ground vias are provided around a high-frequency signal via which is formed to perpendicularly pass through from the top layer to the bottom layer of a multilayer wiring board in which conductor layers and insulator layers are laminated alternately. In the embodiment, this pseudo-coaxial line structure is adopted to form the antenna section 110, the open section 111, and the short section 112.

The antenna section 110 has a pseudo-coaxial line structure with an open end on a side that is to contact the sample (upper side in FIG. 2). Specifically, in the antenna section 110, a land 1100 formed of a conductor is formed on an upper surface of an uppermost insulator layer 22 of the multilayer wiring board 21 and a land 1101 formed of a conductor is formed on a lower surface of a lowermost insulator layer 25. A land 1100 and a land 1101 are connected using a high-frequency signal via 1102 that is a conductor which vertically passes through each of insulator layers 22 to 25 in a direction in which conductor layers 26 to 30 are laminated.

A conductor layer 26 serving as a ground conductor is formed in the same layer as the land 1100 and in a region outside the land 1100. The land 1100 and the conductor layer 26 are separated by a conductor removal region 1103 which does not have a conductor and is circular in a plan view. Similarly, the conductor layer 30 serving as a ground conductor is formed in the same layer as the land 1101 and in a region outside the land 1101. The land 1101 and the conductor layer 30 are separated by a conductor removal region 1104 which does not have a conductor and is circular in a plan view. Note that, in the description, the sensor part 1 is viewed from above (sample side) as a plan view.

A plurality of conductor layers 27 to 29 which serve as ground conductors are formed inside the multilayer wiring board 21. In the antenna section 110, the layer in which the conductor layers 27 to 29 are formed has a conductor removal region 1105 which is circular in a plan view and is a region filled with a dielectric material without a conductor. A high-frequency signal via 1102 passes through the center of conductor removal regions 1103 to 1105. In the antenna section 110, each of the conductor layers 26 to 30 is electrically connected using a through via (through hole) 1106.

Insulator layers 22 to 25, high-frequency signal vias 1102 which vertically pass through the insulator layers 22 to 25, conductor layers 26 to 30 around the high-frequency signal vias 1102, and through vias 1106 which connect conductor layers 26 to 30 constitute a pseudo-coaxial line. As shown in FIG. 3, the high-frequency signal via 1102 and the conductor removal regions 1103 to 1105 are circular. In addition, the impedance of the pseudo-coaxial line can be designed in accordance with the sample to be measured using the diameter of the high-frequency signal via 1102, the diameter of the surrounding conductor removal regions 1103 to 1105, and the dielectric constant of the dielectric of the insulator layer.

Next, the open section 111 has a pseudo-coaxial line structure with an open end on a side that is to contact air (upper side in FIG. 2). In the open section 111, an opening 1110 (recess portion) which is a circular removal region in a plan view is formed in the uppermost conductor layer 26 and the insulator layer 22 of the multilayer wiring board 21 so that the lower insulator layer 23, the conductor layer 27, and the high-frequency signal via 1112 are exposed to the air. A land 1111 formed of a conductor is formed on the lower surface of the lowermost insulator layer 25. The high-frequency signal vias 1112 which are conductors which perpendicularly pass through each of the insulator layers 23 to 25 in the direction in which the conductor layers 26 to 30 are laminated are formed to be connected to the lands 1111. Note that the shape of the opening 1110 does not need to be circular as long as the lower insulator layer 23, the conductor layer 27, and the high-frequency signal via 1112 are exposed to the air.

The land 1101 and the conductor layer 30 are separated using a conductor removal region 1113 which does not have a conductor and is circular in a plan view. The high-frequency signal via 1112 and the conductor layer 27 are separated using a conductor removal region 1114 which does not have a conductor and is circular in a plan view. In the open section 111, in the layer in which the conductor layers 28 and 29 are formed, there is a conductor removal region 1115 which is circular in a plan view and is a region filled with an insulator (dielectric) without a conductor. The high-frequency signal via 1112 passes through the center of the conductor removal regions 1113 to 1115. In the open section 111, each of the conductor layers 27 to 30 is electrically connected using a through via 1116.

The insulator layers 23 to 25, the high-frequency signal vias 1112 which vertically pass through the insulator layers 23 to 25, the conductor layers 27 to 30 around the high-frequency signal vias 1112, and the through vias 1116 which connect conductor layers 27 to 30 constitute a pseudo-coaxial line.

In the open section 111, the incident signal is substantially totally reflected in the same phase. Note that the opening 1110 may include a shielding cap which prevents water, dust, and the like from entering from the outside.

Next, the short section 112 has a pseudo-coaxial line structure in which the center conductor (high-frequency signal via) and the ground are electrically connected at the distal end portion. Specifically, in the short section 112, a land 1120 formed of a conductor is formed on the lower surface of the lowermost insulator layer 25. The conductor layer 26 and the land 1120 are connected using a high-frequency signal via 1121 that is a conductor which vertically passes through the insulator layers 22 to 25 in the direction in which the conductor layers 26 to 30 are laminated.

The land 1120 and the conductor layer 30 are separated using a conductor removal region 1122 which does not have a conductor and is circular in a plan view. In the short section 112, in the layer in which the conductor layers 27 to 29 are formed, there is a conductor removal region 1123 which is circular in a plan view and is a region filled with an insulator (dielectric) without a conductor. The high-frequency signal via 1121 passes through the center of conductor removal regions 1122 and 1123. In the short section 112, each of the conductor layers 26 to 30 is electrically connected using a through via 1124.

The insulator layers 22 to 25, the high-frequency signal vias 1121 which vertically pass through the insulator layers 22 to 25, the conductor layers 26 to 30 around the high-frequency signal vias 1121, and the through vias 1124 which connect the conductor layers 26 to 30 constitute a pseudo-coaxial line.

In the short section 112, the phase of the incident signal is inverted and almost totally reflected.

As described above, the coaxial probe 11 formed on the multilayer wiring board 21 is installed in the dielectric substrate 10. On the upper surface of the dielectric substrate 10, signal lines 40 to 42 formed of a conductor, pads 43 to

45 formed of a conductor formed integrally with the signal lines 40 to 42, and a conductor layer 46 serving as a ground conductor are formed.

The signal lines 40 to 42 and the conductor layer 46 are separated using conductor removal regions 47 to 49 without conductors, respectively. Also, the pads 43 to 45 and the conductor layer 46 are separated using conductor removal regions 50 to 52 which are circular in a plan view and do not have a conductor, respectively. A conductor layer 53 serving as a ground conductor is formed on the lower surface of the dielectric substrate 10.

Connections are provided between the land 1101 and the pad 43, between the land 1111 and the pad 44, between the land 1120 and the pad 45, and between the conductor layer 30 and the conductor layer 46 using a solder 54. In this way, the coaxial probe 11 is installed in the dielectric substrate 10. The solder 54 may have a ball shape.

The load part 13 formed on the dielectric substrate 10 is constituted by a resistor 132 formed between the signal line 130 and the ground conductor 131 and terminates the signal line 130. It is preferable that the reflection from the load part 13 become smaller. For this reason, the resistance value of the resistor 132 is selected to match the impedance of the signal line 130.

Furthermore, switches 12 and 14, an RF connector 15, and control connectors 16 and 17 are installed in the dielectric substrate 10. A signal line 40 connected to the antenna section 110, a signal line 41 connected to the open section 111, and a signal line 42 connected to the short section 112 are each connected to a selection terminal of the switch 12. Thus, any one of the antenna section 110, the open section 111, and the short section 112 can be selected using the switch 12.

A signal line 130 of the load part 13 is connected to one of selection terminals of the switch 14. The other selection terminal of the switch 14 is connected to the input terminal of the switch 12. The input terminal of the switch 14 is connected to the RF connector 15. A control terminal of the switch 12 is connected to the control connector 16 and a control terminal of the switch 14 is connected to the control connector 17. Note that, although an example in which two switches are used is shown in the example, it is also possible to use one 1-input, 4-output switch to select the antenna section 110, the open section 111, the short section 112, and the load part 13. Also, the control connector may include power lines which perform feeding to the switches 12 and 14.

Note that, in embodiments of the present invention, forming the coaxial probe 11 on the multilayer wiring board 21 is not an essential component. That is to say, the multilayer wiring board 21 and the dielectric substrate 10 may be the same board. In this case, there is no need to install different types of boards using a solder or the like.

A one-port VNA calibration method using an open standard, a short standard, and a load standard as calibration standards is known as SOL calibration. In SOL calibration, calibration data is measured by connecting three standards: an open standard, a short standard, and a load standard to the output port of the VNA. With this calibration data, frequency response reflection tracking, directionality, and source match of the measurement system can be eliminated in reflection measurement using the output port to be calibrated (refer to Japanese Patent Application Publication No. 2007-285890).

In the embodiment, the calibration unit 200 of the reflection measurement device 2 outputs control signals to the switches 12 and 14 via the control connectors 16 and 17. Thus, the calibration unit 200 switches the switches 12 and 14 so that any one of the short section 112, the open section 111, and the load part 13 is connected to the port of the reflection measurement device 2 via the RF connector 15. The calibration unit 200 sequentially connects the short section 112, the open section 111, and the load part 13 to the ports of the reflection measurement device 2 and performs reflection measurements on each of them. Furthermore, the calibration unit 200 calculates a calibration coefficient (S parameter of the error circuit existing in the reflection measurement device 2) from the result of the reflection measurement. Thus, by calculating the calibration coefficient, it becomes possible to calculate a reflection coefficient with measurement errors of the reflection measurement device 2 removed. The method for calculating calibration coefficients using SOL calibration is a well-known technique.

With the open end portion of the antenna section 110 that is to contact the sample, the measurement unit 201 of the VNA 2 switches the switches 12 and 14 so that the antenna section 110 is connected to the port of the VNA 2 via the RF connector 15. The measurement unit 201 applies an electric field to the sample from the antenna section 110 and calculates the reflection coefficient on the basis of the amplitude and the phase of the reflected voltage of the reflected wave reflected by the sample and the incident voltage measured using the VNA. At this time, at the antenna section in advance, the reflection coefficient of a standard sample in a shorted state, an open state, and a sample with a known dielectric constant are measured and the complex dielectric constant of the sample is calculated using these reflection coefficients. As described above, the complex dielectric constant may be calculated on the basis of the temporal change in the waveform of the reflected wave.

Figure 4:
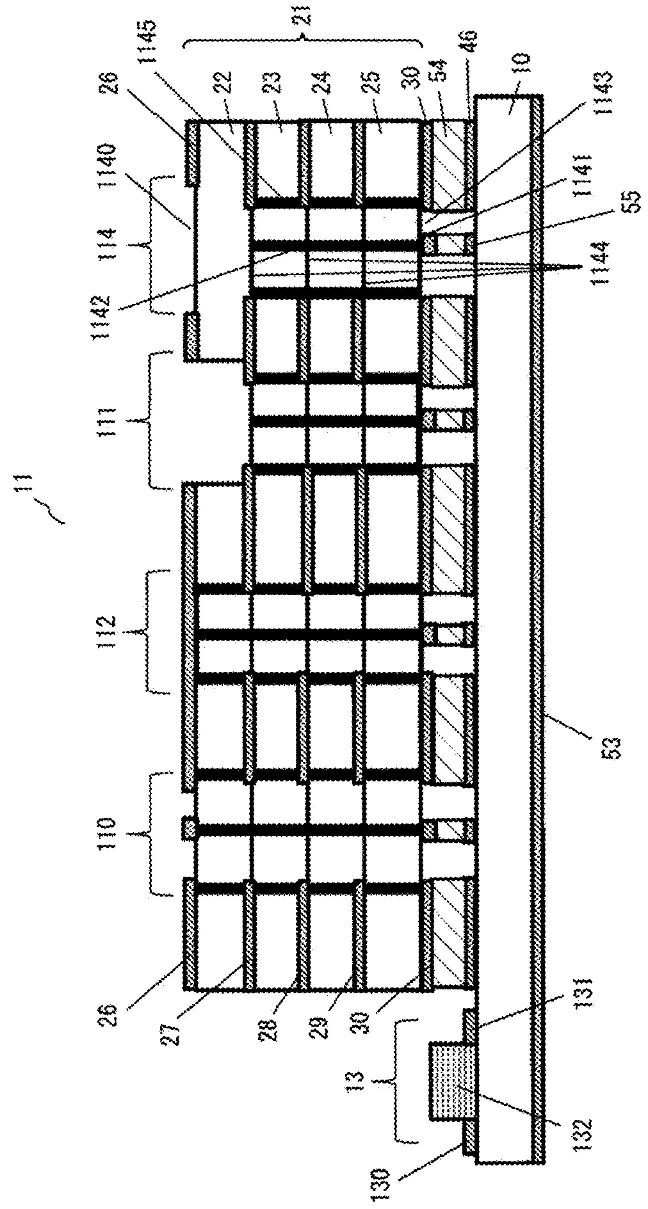
FIG. 4 is a cross-sectional view showing another example of the sensor part according to the embodiment of the present invention.

Also, as shown in FIG. 4, the coaxial probe 11 may include a standard sample section 114 in addition to the short section 112, the open section 111, and the load part 13. In this case, the switch 12 can select any one of the antenna section 110, the open section 111, the short section 112, and the standard sample section 114.

In the standard sample section 114, a conductor removal region 1140 which does not have a conductor and has a circular shape in a plan view is formed in the uppermost conductor layer 26 so that the insulator layer 22 is exposed. A land 1141 formed of a conductor is formed on the lower surface of the lowermost insulator layer 25. High-frequency signal vias 1142 which are conductors which perpendicularly pass through each of the insulator layers 23-25 in the direction in which the conductor layers 26 to 30 are laminated are formed to be connected to the lands 1141.

The land 1141 and the conductor layer 30 are separated using a conductor removal region 1143 which does not have a conductor and has a circular shape in a plan view. In the standard sample section 114, the layer in which the conductor layers 27 to 29 are formed has a conductor removal region 1144 which is circular in a plan view and is a region filled with an insulator (dielectric) without a conductor. The high-frequency signal via 1142 passes through the center of the conductor removal region 1144. In the standard sample section 114, each of the conductor layers 27 to 30 is electrically connected using a through via 1145.

On the upper surface of the dielectric substrate 10, in addition to the signal lines 40 to 42, the pads 43 to 45, and the conductor layer 46, a pad 55 and a signal line (not shown) formed integrally with the pad 55 are formed. The land 1141 and the pad 55 are connected using the solder 54. A signal line formed integrally with the pad 55 is connected to a selection terminal of the switch 12. Thus, any one of the antenna section 110, the open section 111, the short section 112, and the standard sample section 114 can be selected using the switch 12.

When using the standard sample section 114, the complex dielectric constant of the sample can be calculated from the reflection coefficients obtained from the antenna section 110, the short section 112, the open section 111, and the standard sample section 114 and the dielectric constant of the dielectric substrate measured in advance. Note that the standard sample section 114 may include an opening similarly to the open section 111 and filled with a desired dielectric sample. The dielectric sample may be, for example, a ceramic such as alumina, a liquid such as pure water, or a polymer such as polyimide.

As described above, since the antenna section 110, the short section 112, the open section 111, and the load part 13 are integrated on the same substrate in the embodiment, it is possible to reduce the drift error caused by the coaxial probe. Since they are on the same substrate, the temperature difference between the antenna section 110, the short section 112, and the open section 111 is reduced and the calibration accuracy can be improved. Furthermore, in the embodiment, it becomes easy to calibrate the reflection measurement device 2 at any time. Calibration may be performed, for example, at regular intervals or may be performed in accordance with instructions from the user. As a result, in the embodiment, it is possible to perform broadband data acquisition while reducing drift errors due to environmental changes and changes in the state of the sample over time.

Note that, as the RF connector 15 for connecting the sensor part 1 and the reflection measurement device 2, a high frequency connector suitable for the frequency used may be selected.

The microstrip line (signal line or control line) on the dielectric substrate 10 is made of, for example, a metal material with a conductor width of 100 to 300 μm and an interval of 50 μm. Examples of metal materials include Au, Cu, and Al.

The multilayer wiring board 21 has a size of, for example, several cmxseveral cm square and a thickness of 10 to 500 μm. Materials for the insulator layers 22 to 25 (dielectric) include Flame Retardant Type 4 (FR4, Megtron6 (registered trademark), Teflon (registered trademark), Liquid Crystal Polymer (LCP), polyimide, Low Temperature Co-fired ceramics (LTCC), and the like.

Although one antenna section 110 is formed in the coaxial probe 11 in the embodiment, a plurality of antenna sections 110 may be formed and each antenna section 110 may have a different shape. Thus, the antenna section 110 to be used can be selected in accordance with the target sample.

The high-frequency signal via 1102 has a size of, for example, φ0.1 to 0.5 mm. The circular outer diameter of the antenna section 110 (distance from the center of the high-frequency signal via to the surrounding conductor layer) is 0.2 to 2.0 mm. The land 1100 has a size of, for example, φ0.3 to 1.0 mm. Examples of metal materials include Au and Cu.

Figure 5:
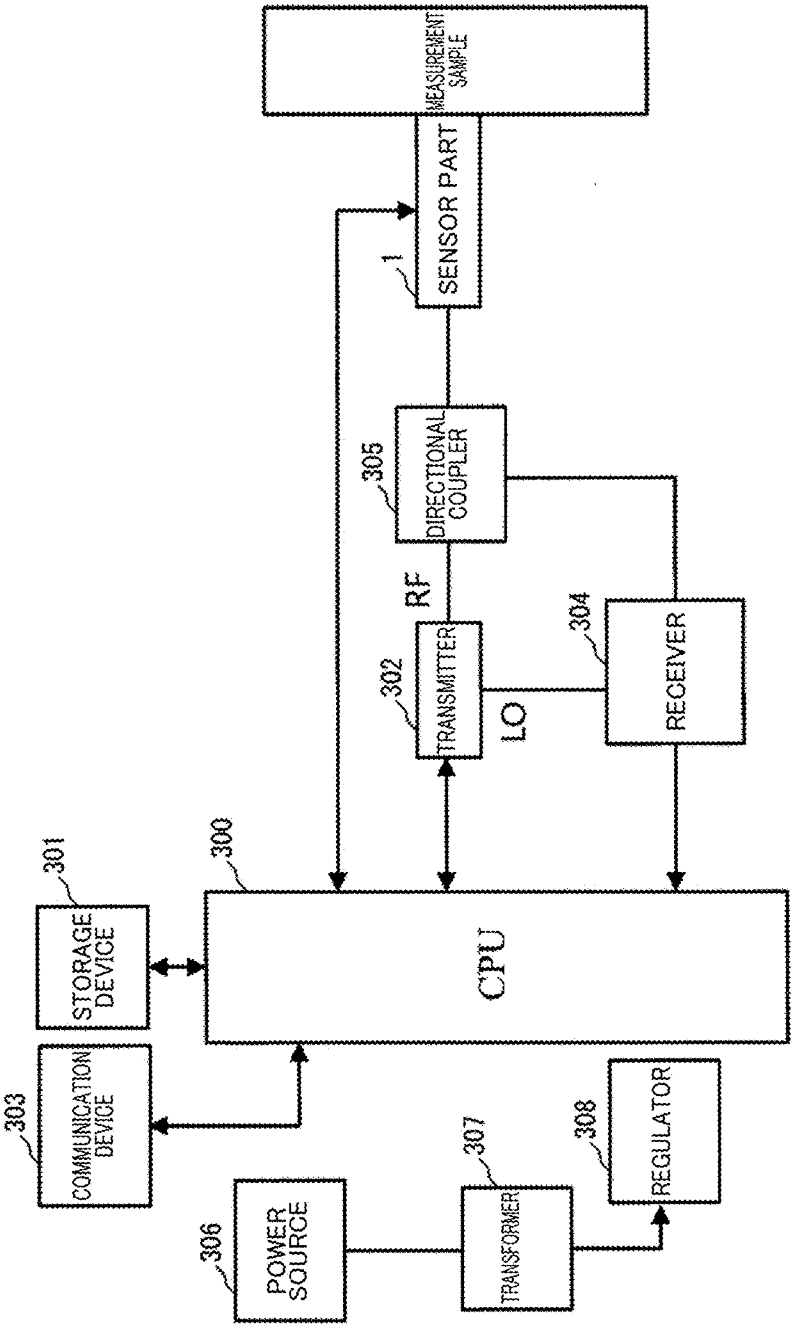
FIG. 5 is a block diagram showing an example of a configuration of a computer which implements a reflection measurement device according to the embodiment of the present invention.
Figure 6:
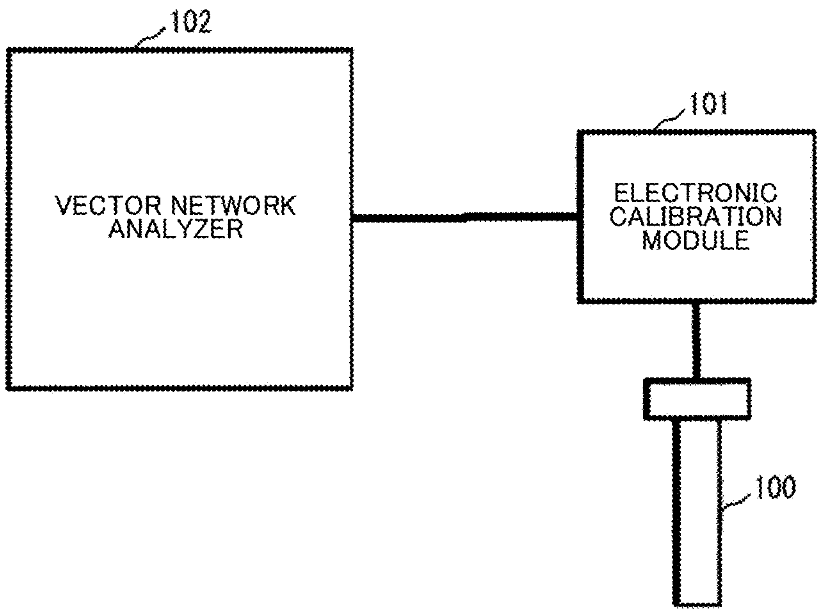
FIG. 6 is a block diagram showing a configuration example of a component concentration measurement device in the related art.

The calibration unit 200 and the measurement unit 201 of the reflection measurement device 2 described in the embodiment can be realized using a computer including a central processing unit (CPU), a storage device, and an interface, and a program which controls these hardware resources. FIG. 5 shows an example of the configuration of this computer.

The computer includes a CPU 300, a storage device 301, a communication device 303, a transmitter 302, a receiver 304, a directional coupler 305, a power source 306, a transformer 307, and a regulator 308. The transmitter 302 and the receiver 304 are connected to the sensor part 1 via the directional coupler 305. The measurement sample is irradiated with microwave band electromagnetic waves generated in the transmitter 302. The signal reflected from the measurement sample is input from the sensor part 1 to the receiver 304 via the directional coupler 305, converted into a digital signal, and then read in the CPU 300. The CPU 300 sequentially reads reflected signals from the antenna section 110, the short section 112, the open section 111, and the load part 13 by outputting a control signal to the sensor part 1 and controlling the switches 12 and 14.

In such a computer, a program for realizing the dielectric spectroscopy measurement method of embodiments of the present invention is stored in the storage device 301. The CPU 300 executes the control and arithmetic processing described in the embodiment in accordance with the program stored in the storage device 301. The reflection coefficient and the dielectric constant determined through the processing are transmitted to an external computer using a communication device 303 connected to the CPU 300. As the transmitter 302, for example, a frequency synthesizer using a phase locked circuit is used. As the receiver 304, for example, a double-balanced mixer is used. A circulator may be used instead of the directional coupler 305.

Although the example of FIG. 5 shows an example of a transmitting and receiving configuration using a direct conversion method, a transmitting and receiving configuration using a low intermediate frequency (IF) method may be adopted by adding a transmitter with a slightly different transmission frequency. A power source 306 supplies power to each device. As the transformer 307, for example, a DC-DC converter is used. The regulator 308 converts the input voltage from transformer 307 to a desired voltage. As the regulator 308, a linear regulator which operates even with a low potential difference between input and output is used. As the power source 306, a lithium ion battery or the like is used.

INDUSTRIAL APPLICABILITY

Embodiments of the present invention can be applied to a dielectric spectrometry device using a coaxial probe.

REFERENCE SIGNS LIST

| | |
|---|---|
| 1 | Sensor part |
| 2 | Reflection measurement device |
| 10 | Dielectric substrate |
| 11 | Coaxial probe |
| 12, 14 | Switch |
| 13 | Load part |
| 15 | RF connector |
| 16, 17 | Control connector |
| 21 | Multilayer wiring board |
| 22 to 25 | Insulator layer |
| 26 to 30, 46, 53 | Conductor layer |
| 40 to 42, 130 | Signal line |
| 43 to 45, 55 | Pad |
| 1100, 1101, 1111, 1120, 1141 | Land |
| 110 | Antenna section |
| 111 | Open section |
| 112 | Short section |
| 114 | Standard sample section |
| 200 | Calibration unit |
| 201 | Measurement unit |

-continued

| | |
|---|---|
| 1102, 1112, 1121, 1142 | High-frequency signal via |
| 1106, 1116, 1124, 1145 | Through via |
| 1110 | Opening |

The invention claimed is:

1. A dielectric spectrometry device, comprising:
a sensor device comprising:
an antenna section including a first coaxial line structure on a base substrate, wherein an open end of the first coaxial line structure is disposed on a side of the first coaxial line structure that is configured to contact a target sample,
an open section including a second coaxial line structure on the base substrate, wherein an open end of the second coaxial line structure is disposed on a side of the second coaxial line structure that is configured to be exposed to air,
a short section including a third coaxial line structure on the base substrate, wherein a center conductor of the third coaxial line structure is conductive with a ground at a side of the third coaxial line structure that is closer to the target sample,
a first signal line on the base substrate,
a load which terminates the first signal line, and
a switch arranged on the base substrate, the switch configured to selectively connect to any one of the antenna section, the open section, the short section, or the load to a port of a reflection measurement device, and
a calibration circuit configured to calibrate the reflection measurement device connected to the sensor device, wherein the calibration circuit controls the switch to sequentially connect the short section, the open section, and the load to the port of the reflection measurement device, allowing the reflection measurement device to perform reflection measurement, for each of the short section, the open section, and the load, and calibrate the reflection measurement device based on a result of the reflection measurement.

2. The dielectric spectrometry device according to claim 1, further comprising:
a measurement device in the reflection measurement device, the measurement device being configured to connect the antenna section to the port via the switch, apply an electric field to the target sample from the antenna section, and calculate a complex dielectric constant of the target sample based on a reflected wave that is reflected by the target sample and received by the antenna section.

3. The dielectric spectrometry device according to claim 1, wherein the antenna section comprises:
a multilayer wiring board including a plurality of insulator layers and a plurality of conductive layers, the plurality of insulator layers and the plurality of conductive layers being alternately stacked.

4. The dielectric spectrometry device according to claim 3, wherein the antenna section further comprises:
a land on a surface of a target sample side of the multilayer wiring board;
a high-frequency signal via passing through the multilayer wiring board in a direction in which the plurality of conductive layers are stacked, wherein a first end of the high-frequency signal via is connected to the land; and
a second signal line on the base substrate and connecting a second end of the high-frequency signal via to the switch.

5. The dielectric spectrometry device according to claim 4, wherein the land and the plurality of conductive layers are separated by a circular region in a plan view without a conductor.

6. The dielectric spectrometry device according to claim 3, wherein radio-frequency signal vias and the plurality of conductive layers are separated by a circular region in a plan view without a conductor.

7. The dielectric spectrometry device according to claim 3, wherein the antenna section further comprises:
a through via formed in the multilayer wiring board to connect the plurality of conductive layers to each other.

8. The dielectric spectrometry device according to claim 1, wherein the open section comprises:
a multilayer wiring board including a plurality of insulator layers and a plurality of conductive layers, the plurality of insulator layers and the plurality of conductive layers being alternately stacked.

9. The dielectric spectrometry device according to claim 8, wherein the open section further comprises:
a high-frequency signal via passing through the multilayer wiring board in a direction in which the plurality of conductive layers are stacked; and
a third signal line on the base substrate and connecting a first end of the high-frequency signal via on the opposite side to the target sample to the switch.

10. The dielectric spectrometry device according to claim 9, wherein the high-frequency signal via and a surrounding conductive layer of the plurality of conductive layers are separated by a circular region in a plan view without a conductor.

11. The dielectric spectrometry device according to claim 10, wherein the multilayer wiring board includes an opening on a surface of a target sample side, so that a surface of an insulator layer of the plurality of insulator layers on the target sample side of the multilayer wiring board, a second end of the high-frequency signal via, and a part of a conductive layer of the plurality of conductive layers surrounding the second end of the high-frequency signal via are exposed to the air.

12. The dielectric spectrometry device according to claim 9, wherein the open section further comprises:
a through via in the multilayer wiring board to connect the plurality of conductive layers to each other.

13. The dielectric spectrometry device according to claim 1, wherein the short section comprises:
a multilayer wiring board including a plurality of insulator layers and a plurality of conductive layers, the plurality of insulator layers and the plurality of conductive layers being alternately stacked.

14. The dielectric spectrometry device according to claim 13, wherein the short section further comprises:
a high-frequency signal via passing through the multilayer wiring board in a direction in which the plurality of conductive layers are stacked, wherein a first end of the high-frequency signal via is connected to a conductive layer on a surface of the multilayer wiring board on a target sample side; and
a fourth signal line formed on the base substrate and connecting a second end of the high-frequency signal via to the switch.

15. The dielectric spectrometry device according to claim 14, wherein the high-frequency signal via and a surrounding conductor layer of the plurality of conductive layers are separated by a circular region in a plan view without a conductor.

16. The dielectric spectrometry device according to claim 13, wherein the short section further comprises:

a through via in the multilayer wiring board and connecting the plurality of conductive layers to each other.

* * * * *